United States Patent
Yamamura et al.

(10) Patent No.: US 7,330,069 B2
(45) Date of Patent: Feb. 12, 2008

(54) DIGITAL SWITCHING AMPLIFIER

(75) Inventors: Ken Yamamura, Sagamihara (JP);
Akihiro Ikehara, Kawasaki (JP);
Naoko Hyodo, Isesaki (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 135 days.

(21) Appl. No.: 11/370,052

(22) Filed: Mar. 8, 2006

(65) Prior Publication Data

US 2006/0202754 A1 Sep. 14, 2006

(30) Foreign Application Priority Data

Mar. 14, 2005 (JP) ............................. 2005-071002

(51) Int. Cl.
*H03F 3/38* (2006.01)
(52) U.S. Cl. ..................................... 330/10; 330/207 A
(58) Field of Classification Search .................. 330/10, 330/207 A, 251
See application file for complete search history.

(56) References Cited

U.S. PATENT DOCUMENTS 5,974,089 A * 10/1999 Tripathi et al. ............... 330/10

6,696,891 B2 * 2/2004 Noro et al. .................... 330/10
6,795,004 B2 * 9/2004 Masuda et al. .............. 341/143
7,102,426 B2 * 9/2006 Kitamura ...................... 330/10

FOREIGN PATENT DOCUMENTS

JP 2000-049613 2/2000
JP 2003-101357 4/2003

* cited by examiner

*Primary Examiner*—Khanh Van Nguyen
(74) *Attorney, Agent, or Firm*—Finnegan, Henderson, Farabow, Garrett & Dunner, L.L.P.

(57) ABSTRACT

There is provided a digital switching amplifier capable of enhancing an S/N ratio at the time of a small signal output and reducing current consumption and electromagnetic interference (EMI). The digital switching amplifier according to the present invention is provided with an integrator 11 for integrating an input signal, quantizer 12 for quantizing the output signal of the integrator 11 with resolutions different for each of the predetermined signal regions, pulse width modulator 13 for performing pulse width modulation for each of signals quantized with different resolutions by the quantizer 12 using different proportionality coefficients, switching circuit 14 for providing the load 15 with electrical signals different in value for each of pulse-width modulated signals with different proportionality coefficients by the pulse width modulator 13 in response to the pulse-width modulated signal, and feedback circuit 17 for negatively feeding back the output of the quantizer 12 to the input of the integrator 11.

12 Claims, 12 Drawing Sheets

DIGITAL SWITCHING AMPLIFIER

BACKGROUND OF THE INVENTION

1. Field of the Invention

The present invention relates to a digital switching amplifier for outputting digital switching signals to drive a resistive, capacitive, or inductive load such as a loudspeaker, headphone, piezoelectric element, heating element, electric motor, or for outputting electrical signals such as voltage, current, or charge.

2. Description of the Related Art

In an audio field, for instance, a digital switching amplifier (or D class amplifier) has been known as an amplifier for driving a low resistive load such as loudspeaker, headphone, and the like to produce an analog audio signal. The amplifier is very useful as a component used in a miniaturized set because it produces a large amplitude output and can be easily integrated into LSI due to its lower heating characteristic resulting from small voltage drop in an amplifier.

In such a field, however, there have been several problems to be solved before manufacturing it as an excellent amplifier. The most important problems which have been tackled include, in particular, improvements in signal-to-noise ratio (S/N ratio) at the time of a small signal output, decrease in current consumption also at the time of a small signal output, reduction in electromagnetic interference (hereinafter referred to as "EMI").

A digital switching amplifier disclosed in JP 2000-49613A has been known as a first example of the related art thereof. This amplifier switch-outputs a noise-shaped Pulse Density Modulation (PDM) signal with plural-value levels. An example of the circuit is shown in FIG. 14.

As shown in FIG. 14, the first example of the related art includes a delta sigma modulating section consisting of a differential integrator 102 and quantizer 103, delay element 104, clock oscillator 105, pulse amplifier 106, low pass filter 107, and attenuator 109.

The delta sigma modulating section delta-sigma-modulates an analog input signal 101, converting into a digital signal. The quantizer 103 converts the analog input signal 101 into the positive/negative digital signals with four values or more and even values. The pulse amplifier 106 switch-controls the application of constant voltage to a load 108 via the low pass filter 107 by the switching control signal corresponding to the positive/negative digital signals with four values or more and even values.

The first example of the related art can ensure a higher S/N ratio because quantizing noises can be decreased as compared to a conventional digital switching amplifier called one-bit amplifier for switch-outputting a PDM signal with binary levels. The application of a lower voltage pulse to a load always (that is, at all times) at the times of a small signal output and of no signal output can further reduce current consumption in comparison with the one-bit amplifier which always applies a higher voltage pulse to a load.

In other words, the current consumption of the one-bit amplifier is VDD/R, where R is a load resistance and VDD is voltage applied across a load. On the other hand, in the amplifier for outputting four-valued levels for each polarity, for example, if a voltage applied across a load at the times of small signal output and of no signal output is 0.25×VDD which is provisionally prepared and is the smallest level, the current consumption equals (0.25×VDD)/R, being one fourth of that of the one-bit amplifier.

Another digital switching amplifier disclosed in JP2003-101357A has been known as a second example of the related art thereof. This amplifier switch-outputs a noise-shaped Pulse Width Modulation (PWM) signal with binary levels. An example of the circuit is shown in FIG. 15.

As shown in FIG. 15, the second example of the related art includes an integrating circuit 201 for integrating an input signal 200, a flash A/D converter 202 for A/D converting the output signal of the integrating circuit 201, a waveform conversion circuit 203 for generating a PWM signal of which pulse width corresponding to a digital value outputted from the flash A/D converter, a switching circuit 204 consisting of a pair of MOS transistors 205 and 206 connected between a first power supply VDD and a second power supply VSS, a node P of the pair of MOS transistors 205 and 206 being connected to a loudspeaker 208 serving as a load through a low pass filter 207, a driving circuit 209 for driving the pair of MOS transistors 205 and 206 in response to the PWM signal outputted from the waveform conversion circuit 203, and a feedback resistor RNF serving as a feedback circuit which is connected to the node P and the input side of the integrating circuit 201 and negatively feeds back an output signal from the amplifier being supplied to the loudspeaker (load) 208.

The second example of the related art constituted in the above manner can further reduce the number of switchings than the foregoing digital switching amplifier called one-bit amplifier for switching and outputting a PDM signal with binary levels, so that EMI can be decreased. The application of an electrical signal to a load only a period during which a pulse width modulation signal is active can reduce an time ratio of an active pulse applied to a load in the times of small signal output and no signal output, thereby reducing a current consumption.

In other words, in the second example of the related art, the current consumption is given by (0.25×VDD)/R, where R is a load resistance, time width of the provisionally prepared smallest pulse for the period of PWM conversion is 0.25, and VDD is voltage applied to a load. This is one fourth of that of the one-bit amplifier using a PDM signal.

The present inventors have not been satisfied with the above related art and therefore endeavored to further increase an S/N ratio at the time of small signal output, further reduce a current consumption at the time of small signal output, and further decrease EMI, as a result, the present inventors have invented a digital switching amplifier far superior to the related art.

That is, the purpose of the present invention is to provide a digital switching amplifier capable of further increasing an S/N ratio and lessening a current consumption at the time of a small signal output and decreasing EMI.

SUMMARY OF THE INVENTION

The digital switching amplifier according to the present invention is configured in the following manner to achieve the above purpose.

According to claim 1 of the present invention, there is provided a digital switching amplifier comprising: an integrator for integrating an input signal; a quantizer for quantizing the output signal of the integretor with resolutions different for each of predetermined signal regions; a pulse width modulator for pulse width modulating the output signal of said quantizer with proportionality coefficients different for each of said predetermined signal regions; and a switching circuit for providing a load with electrical signals different in value for each of said predetermined signal regions in response to the output signal of said pulse width modulator.

According to claim 2 of the present invention, there is provided the digital switching amplifier according to claim 1 comprising: a feedback circuit for taking back the output signal of said quantizer to the input terminal of said integrator as negative feedback.

According to claim 3 of the present invention, there is provided the digital switching amplifier according to claim 1 comprising: a feedback circuit for taking back the output signal of said switching circuit to the input terminal of said integrator as negative feedback.

According to claim 4 of the present invention, there is provided the digital switching amplifier according to claim 1, wherein said quantizer determines which the output signal of said integrator is in said predetermined signal regions, and outputs the determined result to said pulse width modulator and said switching circuit.

According to claim 5 of the present invention, there is provided the digital switching amplifier according to claim 4, wherein the number of said predetermined signal regions is two or more.

According to claim 6 of the present invention, there is provided the digital switching amplifier according to claim 1, wherein said quantizer delivers the output at the region which said quantizer performs quantization with the finest resolution in response to the input signal intended for the level zero signal.

According to claim 7 of the present invention, there is provided the digital switching amplifier according to claim 1, wherein the number of said proportionality coefficients for said pulse width modulator is two or more.

According to claim 8 of the present invention, there is provided the digital switching amplifier according to claim 1, wherein said switching circuit is so configured as to provide said load with the smallest value of the electrical signal at the time of receiving said pulse width modulation signal responding to the quantized signal at said region which said quantizer performs quantization with the finest resolution.

According to claim 9 of the present invention, there is provided the digital switching amplifier according to claim 8, wherein the number of said electrical signals of said switching circuit is two or more.

According to claim 10 of the present invention, there is provided the digital switching amplifier according to claim 1, wherein said switching circuit applies across said load, said electrical signal which direct current level is zero during an inactive period of said pulse width modulation signal, said electrical signal having a value prepared during an active period of said pulse width modulation signal with a first polarity and with a positive polarity of output of said quantizer, and said electrical signal having a value prepared during said active period of said pulse width modulation signal across said load with a polarity reverse to said first polarity and with a negative polarity of output of said quantizer.

According to claim 11 of the present invention, there is provided the digital switching amplifier according to claim 10, wherein said active period of said pulse width modulation signal is a predetermined discrete time width.

According to claim 12 of the present invention, there is provided the digital switching amplifier according to claim 1, wherein said switching circuit provides said load with said electrical signal via a filter connected in series to one terminal or both terminals of said load.

Where, "an active period of the pulse width modulation signal" according to claims 10 and 11 refers to a period of level H in which the amount of a signal is represented by time width with level H in a pulse modulation signal consisting of for example a binary of level H and level L.

The digital switching amplifier with the above configuration according to the present invention is capable of applying a pulse of a small electrical signal (for example, lower voltage) at the time of small signal output or no signal output in response to a pulse width modulation signal across a load with a small time ratio.

For instance, suppose that an electrical pulse applied to a load is one fourth in height and a pulse width is one fourth of the period of PWM conversion, the product of the both is an amount of the electrical signal applied to the load R (that is, current consumption), being one sixteenth as compared to the one-bit amplifier using a PDM signal.

That is to say, the present invention produces an effect by which quantizing noise can be further reduced in comparison with the first example of related art described above, enabling further increasing an S/N ratio, and further decreasing a current consumption.

According to the present invention, further effect is brought about by which the use of PWM can reduces the number of switchings and in particular can minimize an electrical signal (for example, electric potential) to be switched, which further decreases EMI as compared to the second example of the related art described above.

DETAILED DESCRIPTION OF THE PREFERRED EMBODIMENTS

The embodiments according to the present invention are described below with reference to the accompanying drawings.

First Embodiment

The configuration of a first embodiment of a digital switching amplifier according to the present invention is described with reference to FIG. 1.

Figure 1:
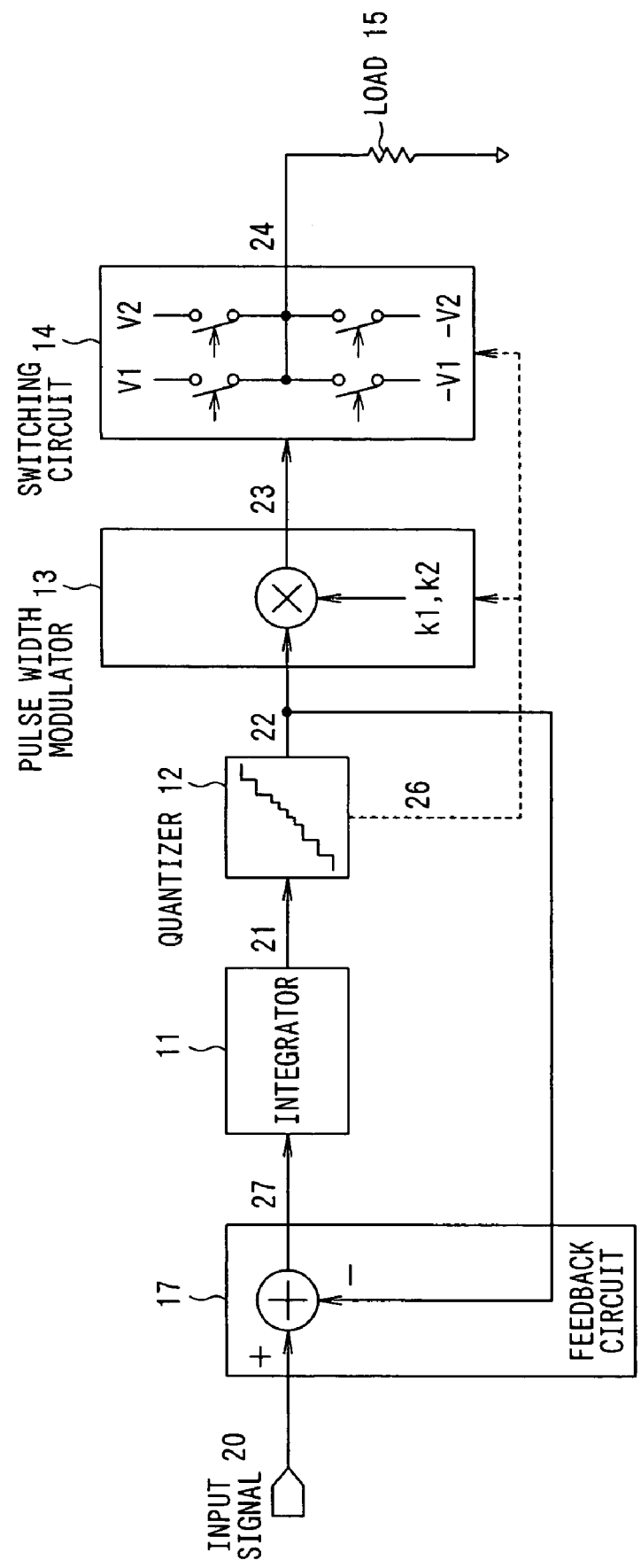
FIG. 1 is a block diagram showing a configuration of a digital switching amplifier according to a first embodiment of the present invention.

As shown in FIG. 1, the digital switching amplifier in the first embodiment includes an integrator 11, quantizer 12, pulse width modulator 13, switching circuit 14, and feedback circuit 17 for negatively feeding back the output of the quantizer 12 to the input of the integrator 11. The output of the switching circuit 14 drives a load 15 such as a loud speaker and the like.

The integrator 11 is a circuit to integrate an input signal 20 as an analog or digital signal. The output 21 of the integrator 11 is supplied to the quantizer 12.

Figure 2:
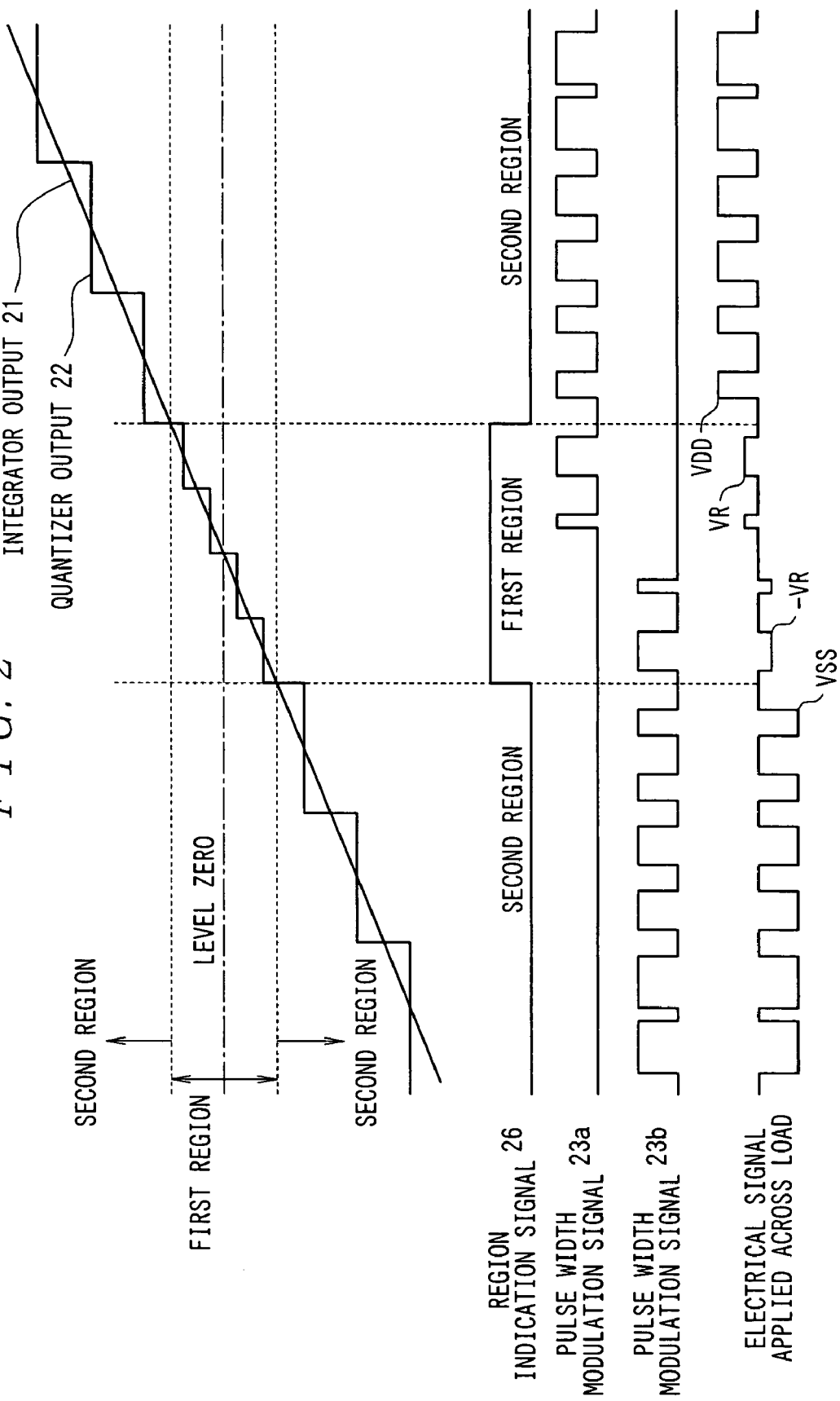
FIG. 2 is a waveform chart of each section for describing the operation of the first embodiment of the present invention.

The quantizer 12 is a circuit to quantize the output 21 of the integrator 11 with predetermined resolutions different for each of signal regions (signal level region) (refer to FIG. 2). The output 22 of the quantizer 12 is fed into the pulse width modulator 13 and fed back to the input of the integrator 11 with the feedback circuit 17.

When the input signal 20 is an analog signal, a feedback signal path from the quantizer 12 in the feedback circuit 17 is provided with a D/A converter. The output 22 of the quantizer 12 is converted to an analog signal and inputted to the integrator 11 for integrating the analog signal.

On the other hand, when the input signal 20 is a digital signal, the output 22 of the quantizer 12 is subjected to an appropriate adjustment in gain as such, thereafter inputted to the integrator 11 for integrating a digital signal.

The pulse width modulator 13 is a circuit to pulse width modulate the output 22 of the quantizer 12 using a proportionality coefficient (for example, k1 or k2) different for each of signals quantized with different resolutions. The proportionality coefficient refers to k in an equation T=kX in which a pulse having a width T proportional to a value X intended by the output 22 of the quantizer 12 is generated.

The switching circuit 14 is a circuit to provide a load 15 with electric signals different in value for each of the pulse-width modulated signals using different proportionality coefficients (for example, positive voltage V1, positive voltage V2, negative voltage −V1, negative voltage −V2) in response to a pulse-width modulated signal 23. For this reason, the switching circuit 14 is composed of four electronic switches which are on-off controlled in response to at least the output 23 of the pulse width modulator 13.

The quantizer 12 delivers the output 22 thereof as quantizing information and an region indicating signal 26 denoting a signal region different in resolution. The region indicating signal 26 causes the pulse width modulator 13 and switching circuit 14 to perform corresponding operations.

If a relationship of the output code of the quantizer 12 to a signal region where the output code is quantized with what resolution is defined in advance, the region indicating signal 26 can be inputted only to the switching circuit 14, or the pulse width modulator 13 can be caused to generate the same indicating signal to provide the switching circuit 14 with the region indicating signal 26.

An operational example of the first embodiment with the above configuration is described below while referencing FIGS. 1 and 2.

The upper half in FIG. 2 shows change in the output 21 of the integrator 11 and the output 22 of the quantizer 12 according as the output 21 of the integrator 11 is increased with time. The lower half in FIG. 2 shows waveforms of the region indicating signals 26, output signals 23 from the pulse width modulator 13 (consisting of pulse width modulation signals 23a and 23b), and electric signals (that is, the output 24 of the switching circuit 14) applied across the load 15.

The integrator 11 shown in FIG. 1 integrates a differential signal between the input signal 20 and the feedback signal from the feedback circuit 17. The integrator output 21 is shown in FIG. 2. As shown in FIG. 2, a level zero on the output 22 of the integrator 11 lies at the center of a first region. The regions at which signals are positive in polarity and higher in level and those are negative in polarity and lower in level than the first region are set to a second region respectively.

The quantizer 12 quantizes the output 21 of the integrator 11. The quantizer output 22 is shown in FIG. 2. As shown in FIG. 2, the quantizing resolution of the quantizer 12 is set finer at the first region than that at the second region.

The pulse width modulator 13 pulse width modulates the output 22 of the quantizer 12. The output signal 23 thereof is shown in FIG. 2. That is to say, the pulse width modulator 13 allocates one signal for each of outputs with positive and negative polarity from the quantizer 12 to deliver two pulse width modulation signals 23a and 23b as output signals. A modulation coefficient (that is, a coefficient determining the width of output signal with respect to the input signal) of the pulse width modulator 13 is larger at the first region than that at the second region. (Refer to FIG. 2)

The switching circuit 14 turns on a switch for outputting a positive voltage V1 (VDD) or a positive voltage V2 (VR) at the interval of a level H on the pulse width signal 23a outputted from the pulse width modulator 13, and turns on a switch for outputting a negative voltage −V1 (VSS) or a negative voltage −V2 (−VR) at the interval of level H on the pulse width signal 23b. Selecting whether to output a positive voltage V1 or negative voltage −V1, or positive voltage V2 or negative voltage −V2 depends on polarity of the region indicating signal 26 from the quantizer 12. For example, when the region indicating signal 26 is a level H, the positive voltage V1 or negative voltage −V1 is selected. When the region indicating signal 26 is a level L, the positive voltage V2 or negative voltage −V2 is selected. (Refer to FIG. 2)

The value of the electrical signal applied to the load 15 by the switching circuit 14 is set smaller at the first region than at the second region. A time-averaged mean value of the electric signal applied to the load 15 is a product of the rate of pulse width and the value of the electrical signal. The product is adapted to be in linear proportion to the value of the output 22 of the quantizer 12 in common irrespective of the two regions of quantizing resolution.

In the digital switching amplifier according to the first embodiment described above, the input signal of the quantizer 12 is noise-shaped to be an output thereof by the effectiveness of negative feedback in a system with a very high gain provided by the integrator 11 at the lower frequency region. The output of the switching circuit 14 for driving the load 15 being equal to the output signal of the quantizer 12 includes noise-shaped noises, but audible lower frequency signals are equal to the input signal.

It is noteworthy in the first embodiment when the input signal 20 is absent or smaller corresponding to the first region of the integrator output 21. In this case, the switching circuit 14 drives the load 15 with finer quantizing resolutions of the quantizer 12. For this reason, the switching circuit 14 can output pulses with the smallest time width and small electrical signal which can be set when the first embodiment is configured with LSI and the like.

The waveforms of the electrical signal applied to the load 15 is shown at the lower most part of FIG. 2. In the first region, quantization noise is smaller and an S/N ratio is higher than those in the related art. The product of switching electrical value and time is small, so that current consumption is small. A small difference between the switching electrical signals allows generation of EMI to lessen.

The detailed configuration of each section shown in FIG. 1 to be integrated into MOS transistors on a semiconductor substrate according to the first embodiment is described below with reference to FIGS. 3 to 8.

Figure 3:
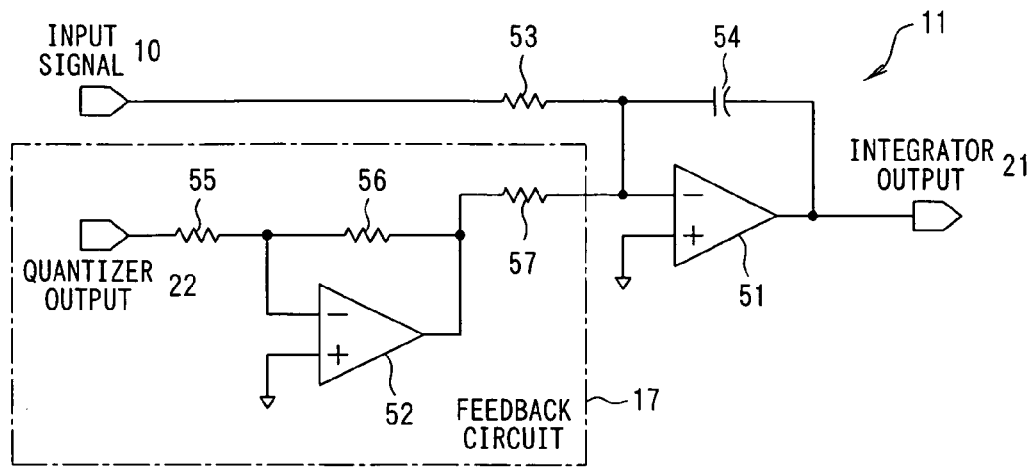
FIG. 3 is a circuit diagram showing a detailed configuration of an integrator and feedback circuit.

FIG. 3 shows examples of the integrator 11 and a feedback circuit 17 illustrated in FIG. 1. An area surrounded by the dashed line shows the feedback circuit 17. The other area shows the integrator 11.

As shown in FIG. 3, the integrator 11 is composed of an operational amplifier 51 using MOS transistors, poly resistor 53 for input, and integral capacitor element 54 formed between double layers of polysilicon as a capacitive element. The integrator 11 may be primary, or secondary or higher.

As shown in FIG. 3, the feedback circuit 17 includes an inverting buffer for inverting the output 22 of the quantizer 12 (in this example, consisting of an operational amplifier 52 and resistors 55 and 56) and a feedback signal inputting resistor 57 for supplying the output of the inverting buffer to the input of the integrator 11.

Figure 4:
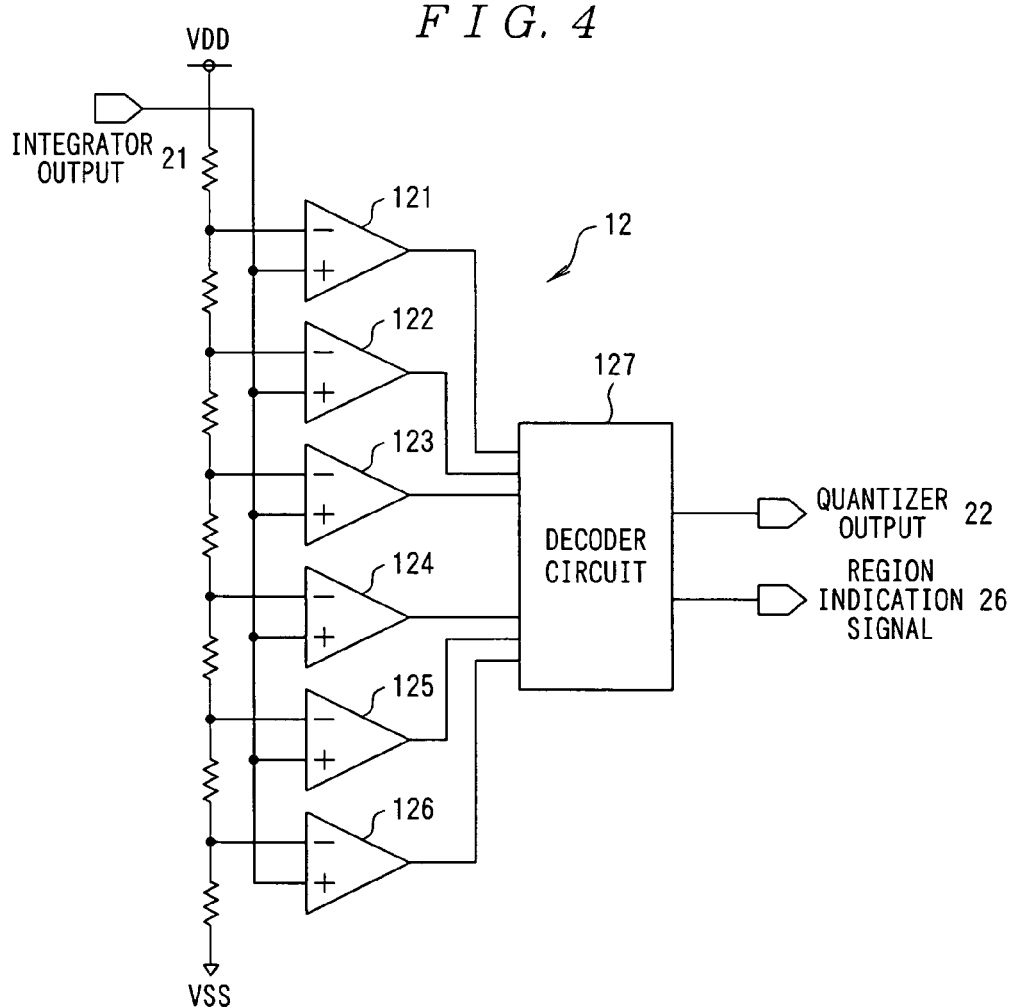
FIG. 4 is a circuit diagram showing a detailed configuration of a quantizer.

FIG. 4 shows an example of a circuit for the quantizer 12 shown in FIG. 1.

As shown in FIG. 4, the quantizer 12 includes a flash A/D converter.

The flash A/D converter, as shown in the figure, is equipped with a resistive ladder connected between a power supply VDD and a ground VSS, a plurality of comparators 121 to 126, and a decoder circuit 127.

The comparators 121 to 126 compare the voltages at the tapping points of the abovementioned resistive ladders with the integrator output 21 respectively and output signals to a decoder 127 according to the comparison results.

The decoder 127 logically decodes each of the outputs from the comparators 126 to 126 to deliver the quantizer output 22 and also outputs the region indicating signal 26 for indicating where the output lies in a region of quantizing resolution.

Figure 7:
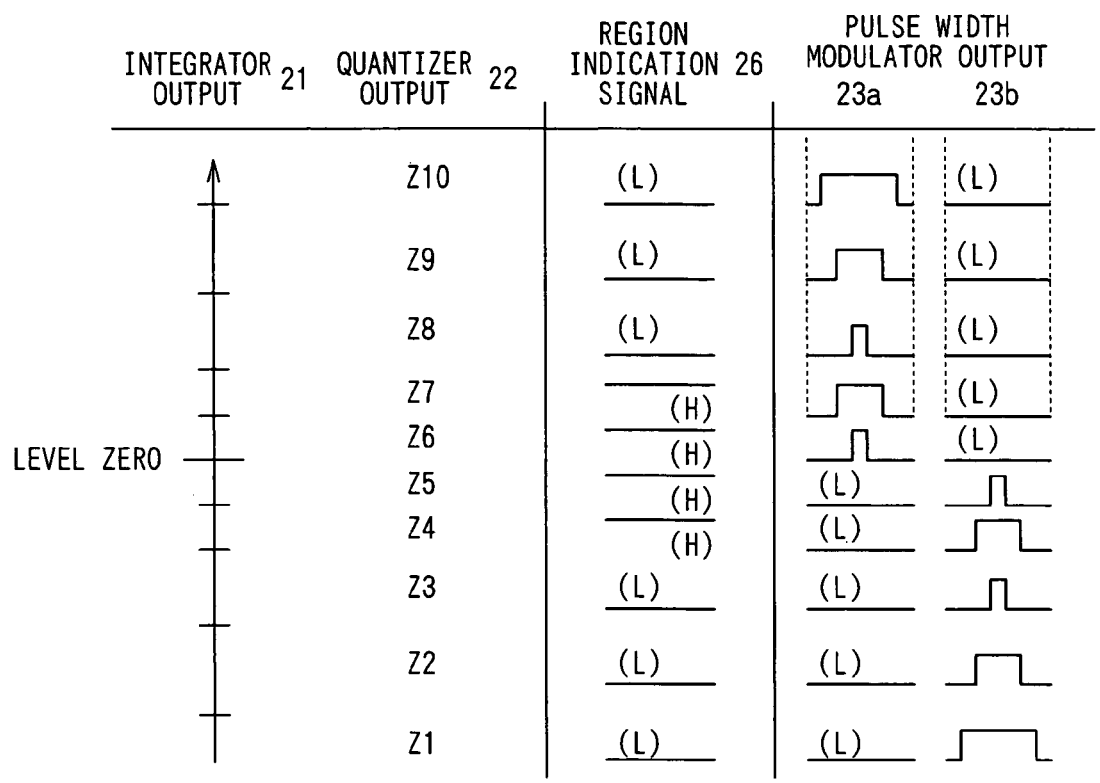
FIG. 7 is an explanatory drawing showing relationship between the input and the output of the pulse width modulator.

FIG. 7 shows examples of the quantizer output 22 from the decoder 127 and the region indicating signals 26 outputted in response to the quantizer output 22.

The outputting operation of the flash A/D converter shown in FIG. 4 depends on its relation with the period of PWM conversion of the pulse width modulator 13 at the following stage, for example, the converter operates at a predetermined time interval of 0.1 to 10 microseconds.

It is preferable that increments are finer of resistor tap portions (increments between tapping points of the resistive ladders) corresponding to a level-zero signal input of the quantizer 12 (that is, input signal being a midpoint between a positive and negative alternating current (AC) signal and intended for DC ground of the signal).

Figure 5:
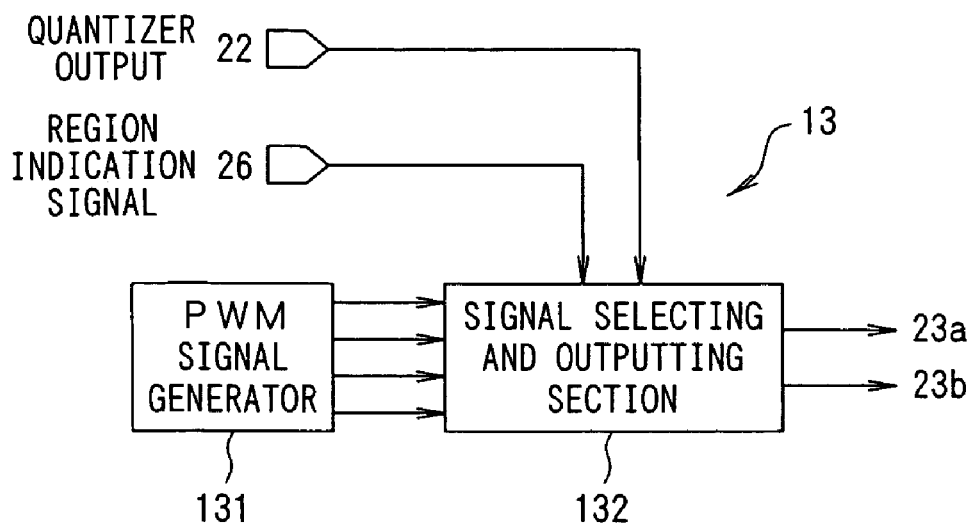
FIG. 5 is a circuit diagram showing a detailed configuration of a pulse width modulator.

FIG. 5 shows an example of the pulse width modulator 13 shown in FIG. 1.

As shown in FIG. 5, the pulse width modulator 13 consists of a PWM signal generating section 131 and a signal selecting and outputting section 132.

Figure 6:
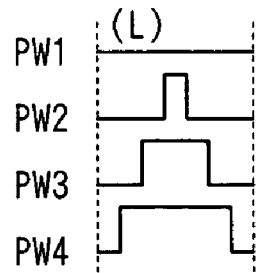
FIG. 6 is a chart showing an example of output waveforms of a PWM signal generator.

The PWM signal generating section 131 always outputs pulse width signals PW1 to PW4 for example as shown in FIG. 6. The signal selecting and outputting section 132 selectively outputs any of the pulse width signals PW1 to PW4 generated by the PWM signal generating section 131 in response to the output signal 22 of the quantizer 12 and the region indicating signal 26.

The operation of the pulse width modulator 13 with the above configuration is described with reference to FIGS. 5 and 7.

As shown in FIG. 7, the output 22 of the quantizer 12 is quantized to Z1 to Z9 according to the output 21 of the integer 11. The region indicating signal 26 outputted from the quantizer 12 comes into a level L, or level H according to the quantized levels Z1 to Z9.

As shown in FIG. 7, the signal selecting and outputting section 132 shown in FIG. 5 selectively outputs two out of the pulse width signals PW1 to PW4 generated by the PWM signal generating section 131 in response to the outputs Z1 to Z9 and the region indicating signal 26 from the quantizer 12, thus outputting two-bit signals 23a and 23b shown in the right most column in FIG. 7.

The form selected and outputted by the signal selecting and outputting section 132 is greatly affected by the region indicating signal 26 from the quantizer 12. In this example, a coefficient of PWM width conversion is larger when the region indicating signal is a level H, and it is smaller when the region indicating signal is level L.

Figure 8:
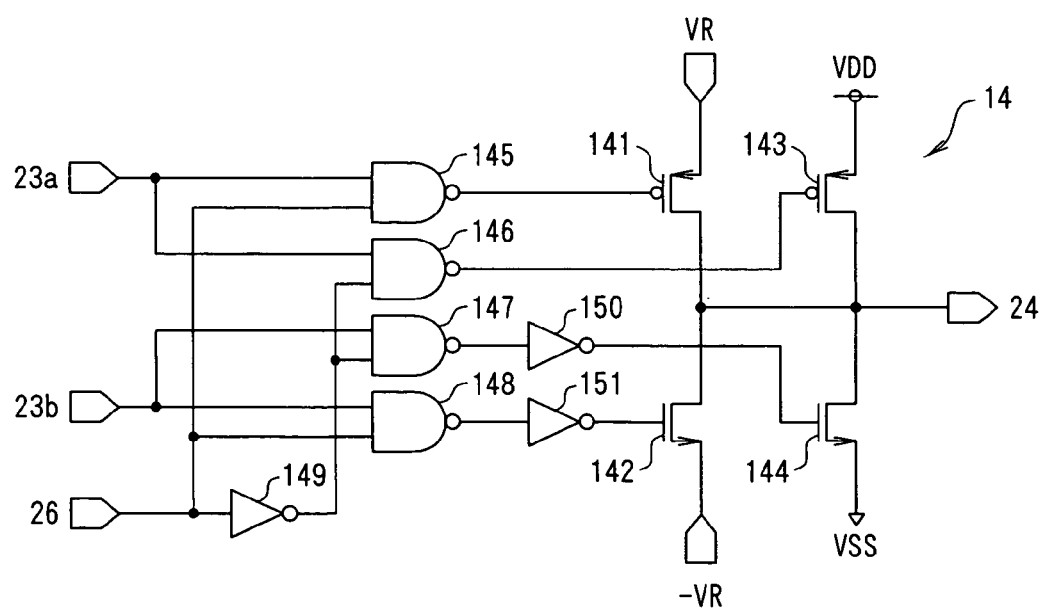
FIG. 8 is a circuit diagram showing a detailed configuration of a switching circuit.

FIG. 8 shows an example of the switching circuit 14 in shown in FIG. 1.

As shown in FIG. 8, the switching circuit 14 includes p-type MOS transistor 141, n-type MOS transistor 142, p-type MOS transistor 143, n-type MOS transistor 144, four NAND circuits 145 to 148, and three inverter circuits 149 to 151.

The MOS transistors 141 and 142 are connected in series to each other. A positive voltage VR is applied across the source of the MOS transistor 141 and a negative voltage −VR is applied across the source of the MOS transistor 142. The MOS transistors 143 and 144 are connected in series to each other. A positive power supply VDD is supplied to the source of the MOS transistor 143 and a negative power supply VSS is supplied to the source of the MOS transistor 144.

The gate of the MOS transistor 141 is supplied with a signal produced by the NAND circuit 145 processing the output signal 23a of the signal selecting and outputting section 132 and the region indicating signal 26 from the quantizer 12 in FIG. 5, thereby on-off controlling the MOS transistor 141.

The gate of the MOS transistor 142 is supplied with a signal inverted by the inverter 151, the signal being produced by the NAND circuit 148 processing the output signal 23b of the signal selecting and outputting section 132 and the above region indicating signal 26 in FIG. 5, thereby on-off controlling the MOS transistor 142.

The gate of the MOS transistor 143 is supplied with a signal produced by the NAND circuit 146 processing the above output signal 23a and the above region indicating signal 26 inverted by the inverter circuit 149, thereby on-off controlling the MOS transistor 143.

The gate of the MOS transistor 144 is supplied with a signal inverted by the inverter 150, the signal being produced by the NAND circuit 147 processing the above output signal 23b and the region indicating signal 26 inverted by the inverter circuit 149, thereby on-off controlling the MOS transistor 144.

According to the switching circuit 14 with the above configuration, in the case of switching and outputting in the second region where a quantizing resolution is coarse, the MOS transistor 143 is turned on to output a positive power supply VDD as a positive voltage V2, and the MOS transistor 144 is turned on to output a positive power supply VSS as a positive voltage −V2.

On the other hand, in the case of switching and outputting in the first region where a quantizing resolution is fine, the MOS transistor 141 is turned on to output a positive power supply VR as a positive voltage V1, and the MOS transistor 142 is turned on to output a negative voltage −VR which is an electric potential symmetrical to VR with respect to the midpoint between the positive power supply VDD and the negative power supply VSS, as a negative voltage −V1.

The midpoint between V1 and (VDD and VSS) is set to be smaller than (VDD−VSS)/2, and V1 or −V1 is used to perform switching and outputting of small electrical signals.

Second Embodiment

The configuration of a second embodiment of the digital switching amplifier according to the present invention is described with reference to FIG. 9.

Figure 9:
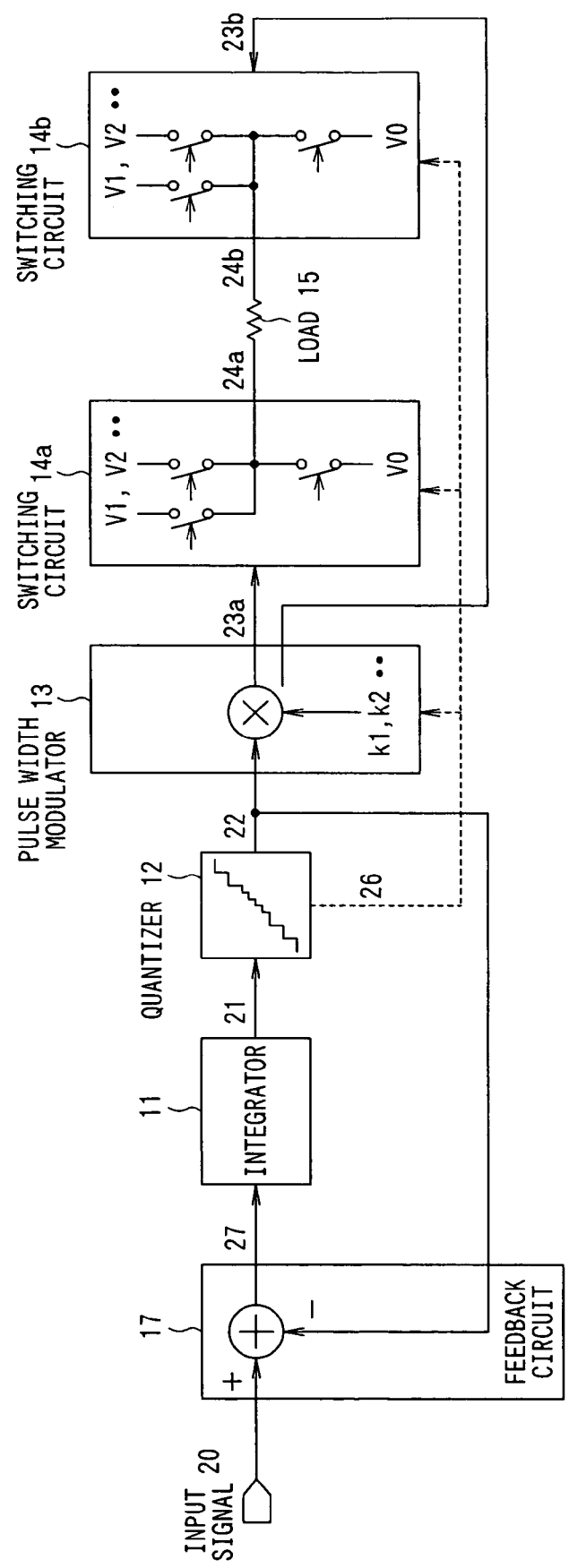
FIG. 9 is a block diagram showing a configuration of a digital switching amplifier according to a second embodiment of the present invention.

As shown in FIG. 9, the digital switching amplifier according to the second embodiment includes an integrator 11, quantizer 12, pulse width modulator 13, switching circuits 14a and 14b, and feedback circuit 17 for negatively feeding back the output of the quantizer 12 to the input of the integrator 11. Differential output of a pair of the switching circuits 14a and 14b drives both terminals of the load 15 such as a loudspeaker and the like.

The second embodiment is the same in basic configuration as the first embodiment shown in FIG. 1, so that the same components are given the same reference characters to omit describing the configuration, and points different in configuration are mainly described.

That is to say, the second embodiment includes a pair of switching circuits 14a and 14b instead of the switching circuit 14 shown in FIG. 1.

The switching circuits 14a and 14b provide a load 15 with such electrical signals as a positive voltage V1, positive voltage V2, negative voltage −V1, and negative voltage −V2 different in value for each of the signals pulse-width modulated using different proportionality coefficients in response to pulse-width modulated signals 23a and 23b.

When the above operation is expressed by (the output of the switching circuit 14a)−(the output of the switching circuit 14b), the four abovementioned outputs can be realized by switching/outputting (V1−V0), (V0−V1), (V2−V0) and (V0−V2). Thereby the second embodiment can provide an output amplitude twice as large as the first embodiment, which can produce louder sound.

The detailed configuration of the switching circuits 14a and 14b shown in FIG. 9 to be integrated into MOS transistors on a semiconductor substrate is described below with reference to FIGS. 10A and 10B.

Figure 10A:
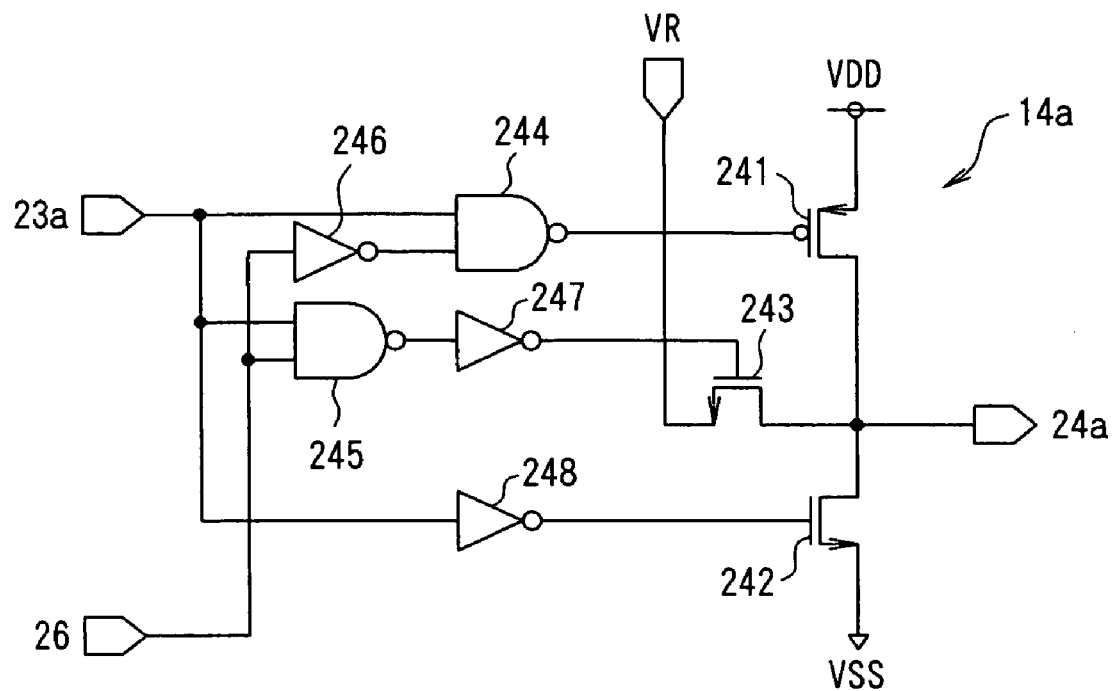
FIGS. 10A and 10B are circuit diagrams showing a detailed configuration of a switching circuit according to the second embodiment.

As shown in FIG. 10A, the switching circuit 14a includes p-type MOS transistor 241, n-type MOS transistors 242 and 243, NAND circuits 244 and 245, and inverter circuits 246 to 248.

The MOS transistors 241 and 242 are connected in series to each other. A power supply VDD is connected to the source of the MOS transistor 241, and a power supply VSS is connected to the source of the MOS transistor 242.

The gate of the MOS transistor 241 is supplied with a signal produced by the NAND circuit 244 processing the output signal 23a of the signal selecting and outputting section 132 and the region indicating signal 26 inverted by the inverter circuit 246, thereby on-off controlling the MOS transistor 241.

The gate of the MOS transistor 242 is supplied with the above output signal 23a inverted by the inverter circuit 248, thereby on-off controlling the MOS transistor 242.

The source of the MOS transistor 243 is supplied with the voltage VR. The drain of the MOS transistor 243 is connected to the common connection portion of the MOS transistors 241 and 242. The gate of the MOS transistor 243 is supplied with a signal inverted by the inverter 247, the signal being produced by the NAND circuit 245 processing the above output signal 23a and the region indicating signal 26, thereby on-off controlling the MOS transistor 243.

Figure 10B:
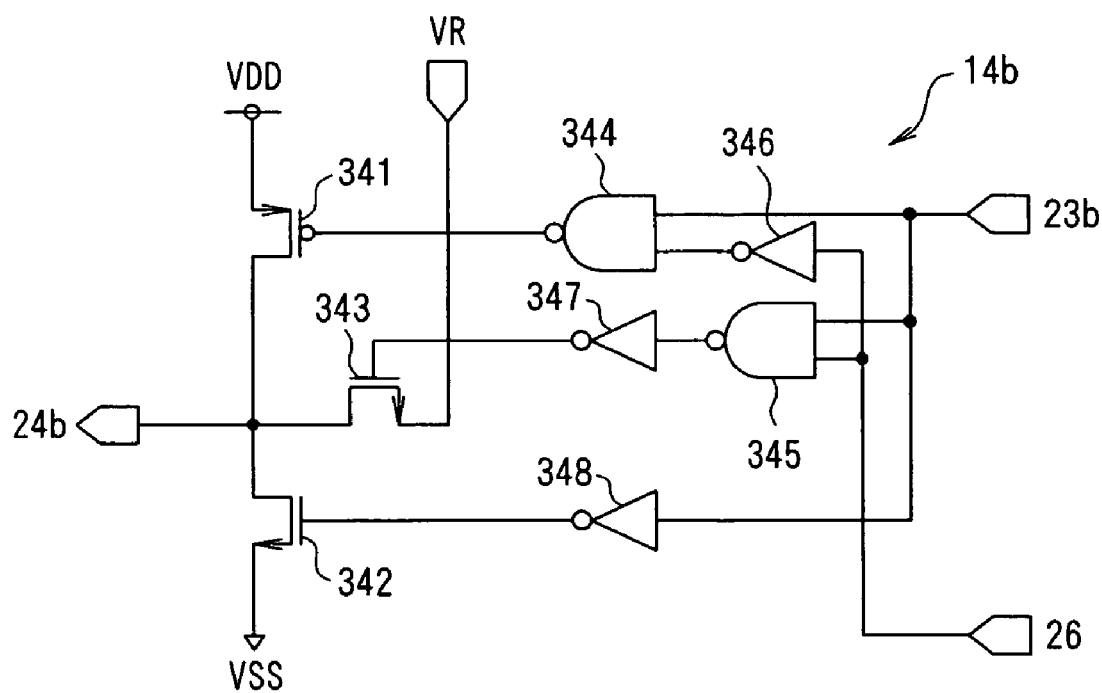

As shown in FIG. 10B, the switching circuit 14b includes p-type MOS transistor 341, n-type MOS transistors 342 and 343, NAND circuits 344 and 345, and inverter circuits 346 to 348.

The MOS transistors 341 and 342 are connected in series to each other. A power supply VDD is connected to the source of the MOS transistor 341 and a power supply VSS is connected to the source of the MOS transistor 342.

The gate of the MOS transistor 341 is supplied with a signal produced by the NAND circuit 344 processing the output signal 23b of the signal selecting and outputting section 132 and the region indicating signal 26 from the quantizer 12 in FIG. 5 inverted by the inverter circuit 346, thereby on-off controlling the MOS transistor 341.

The gate of the MOS transistor 342 is supplied with the above output signal 23b inverted by the inverter circuit 348, thereby on-off controlling the MOS transistor 342.

The source of the MOS transistor 343 is supplied with the voltage VR. The drain of the MOS transistor 343 is connected to the common connection portion of the MOS transistors 341 and 342. The gate of the MOS transistor 343 is supplied with a signal inverted by the inverter 347, the signal being produced by the NAND circuit 345 processing the above output signal 23b and the above region indicating signal 26, thereby on-off controlling the MOS transistor 343.

According to the switching circuits 14a and 14b with the above configuration, in case of switching and outputting in the second region where a quantizing resolution is coarse, the MOS transistor 241 in the switching circuit 14a is turned on to output a positive power supply VDD as a positive voltage V2, and the MOS transistor 342 in the switching circuit 14b is turned on to output a negative power supply VSS.

Similarly, the MOS transistor 242 in the switching circuit 14a is turned on to output a negative power supply VSS as negative voltage −V2, and the MOS transistor 341 in the switching circuit 14b is turned on to output a positive power supply VDD.

In case of switching and outputting in the first region where a quantizing resolution is fine, the MOS transistor 243 in the switching circuit 14a is turned on to output a positive voltage VR as a positive voltage V1, and the MOS transistor 342 in the switching circuit 14b is turned on to output negative power supply VSS. Similarly, the MOS transistor 242 in the switching circuit 14a is turned on to output a negative power supply VSS as a negative voltage −V1, and the MOS transistor 343 in the switching circuit 14b is tuned on to output a positive voltage VR.

In the second embodiment, the positive voltage VR can be set at a voltage approximate to the negative power supply VSS, so that the switches configured with n-type MOS transistors 243 and 343 are shown in FIGS. 10A and 10B.

Third Embodiment

The configuration of a third embodiment of the digital switching amplifier according to the present invention is described with reference to FIG. 11.

Figure 11:
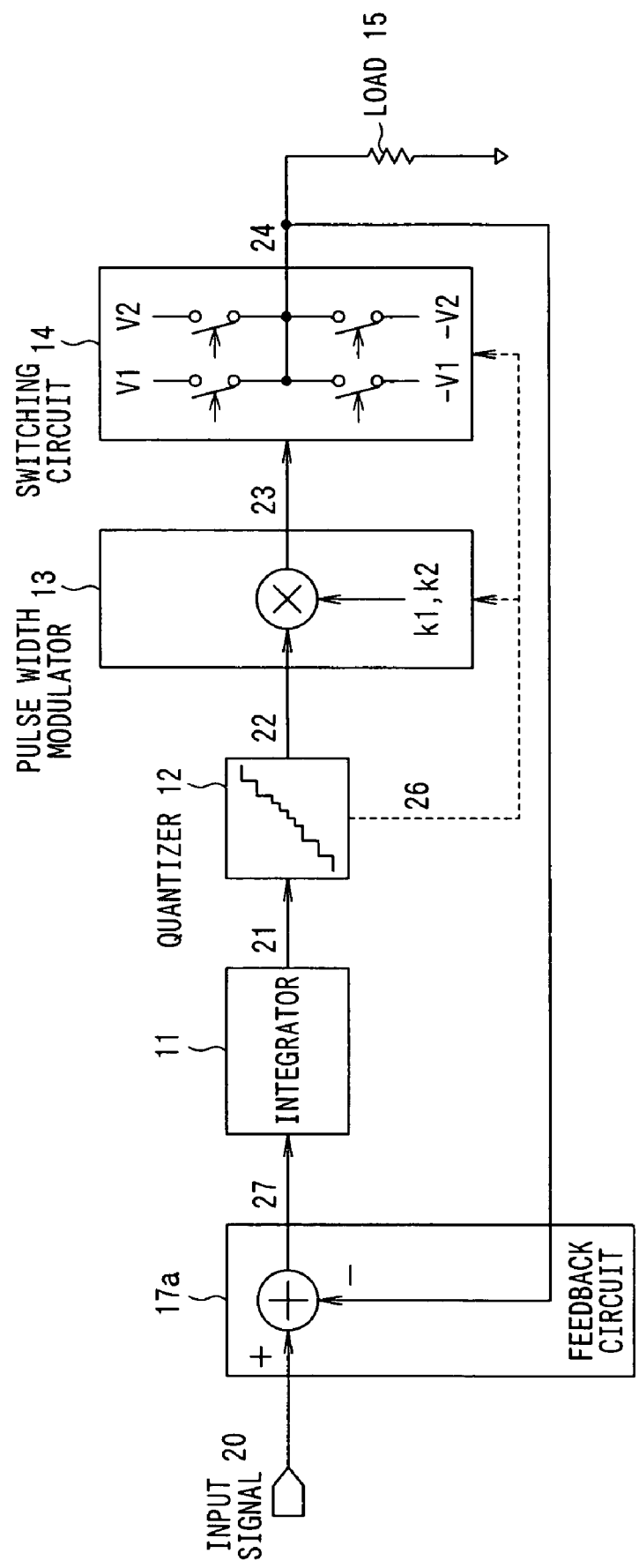
FIG. 11 is a block diagram showing a configuration of a digital switching amplifier according to a third embodiment of the present invention.

As shown in FIG. 11, in the third embodiment, the digital switching amplifier includes an integrator 11, quantizer 12, pulse width modulator 13, switching circuit 14, and feedback circuit 17a for negatively feeding back the output of the switching circuit 14 to the input of the integrator 11. The output of the switching circuit 14 drives the load 15 such as a loudspeaker and the like.

The third embodiment is the same in basic configuration as the first embodiment shown in FIG. 1, so that the same components are given the same reference characters to omit describing the configuration, and points different in configuration are mainly described.

That is to say, in the third embodiment, the feedback circuit 17 shown in FIG. 1 is replaced by a feedback circuit 17a as depicted in FIG. 11. The feedback circuit 17a is so configured as to negatively feed back the output of the switching circuit 14 to the input of the integrator 11.

In the feedback circuit 17 in FIG. 1, when the input signal 20 is an analog signal, the output 22 of the quantizer 12 as a digital signal needs D/A converting to an analog signal and feeding it back to the integrator 11.

In the feedback circuit 17a in FIG. 7, however, the D/A conversion is realized using the pulse width modulator 13 and switching circuit 14, so that the output of the switching circuit 14 can be directly used as a feedback signal.

Fourth Embodiment

The configuration of a fourth embodiment of the digital switching amplifier according to the present invention is described with reference to FIG. 12.

Figure 12:
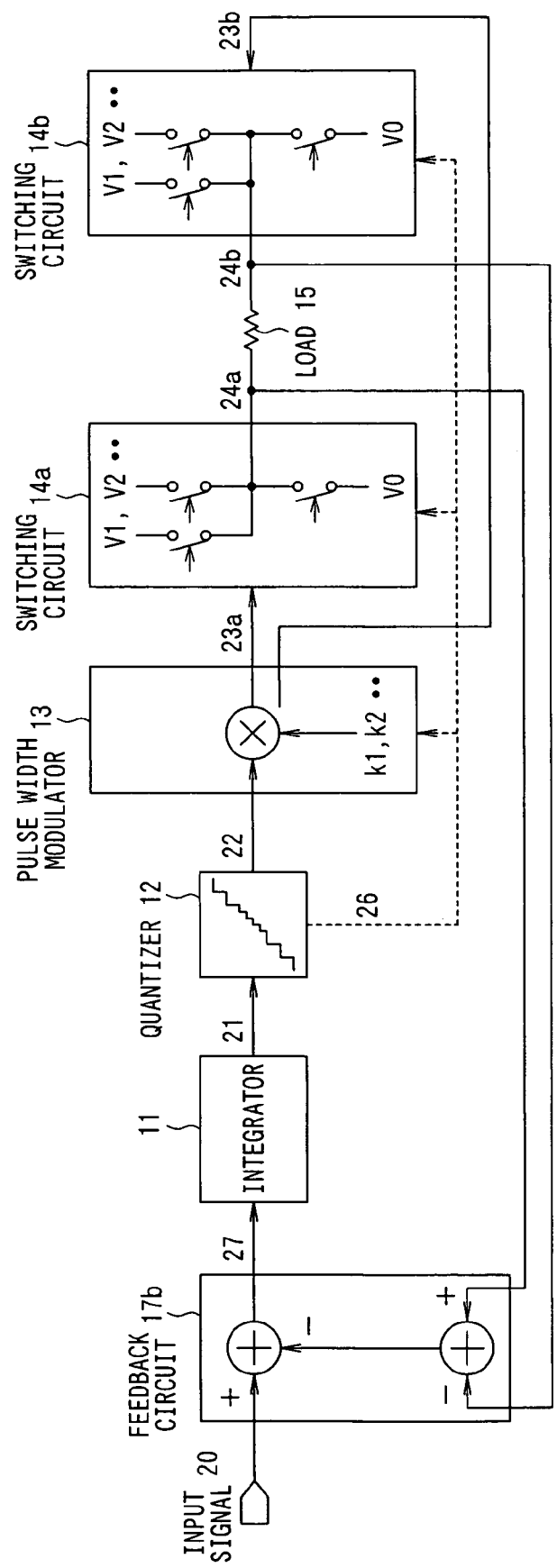
FIG. 12 is a block diagram showing a configuration of a digital switching amplifier according to a fourth embodiment of the present invention.

As shown in FIG. 12, in the fourth embodiment, the digital switching amplifier includes an integrator 11, quantizer 12, pulse width modulator 13, switching circuits 14a and 14b, and feedback circuit 17b for negatively feeding back the outputs of the switching circuits 14a and 14b to the input of the integrator 11. Differential output of a pair of the switching circuits 14a and 14b drives both terminals of the load 15 such as a loudspeaker and the like.

The fourth embodiment is the same in basic configuration as the second embodiment shown in FIG. 9, so that the same components are given the same reference characters to omit describing the configuration, and points different in configuration are mainly described.

That is to say, in the fourth embodiment, the feedback circuit 17 shown in FIG. 9 is replaced by a feedback circuit 17b as illustrated in FIG. 12. The feedback circuit 17b is so configured as to negatively feed back the outputs of the switching circuits 14a and 14b to the input of the integrator 11.

In the feedback circuit 17 in FIG. 9, when the input signal 20 is an analog signal, the output 22 of the quantizer 12 as a digital signal needs D/A converting to an analog signal and feeding it back to the integrator 11.

In the feedback circuit 17b in FIG. 12, however, the D/A conversion is realized using the pulse width modulator 13 and the switching circuits 14a and 14b, so that the outputs of the switching circuits 14a and 14b can be directly used as a feedback signal.

Figure 13:
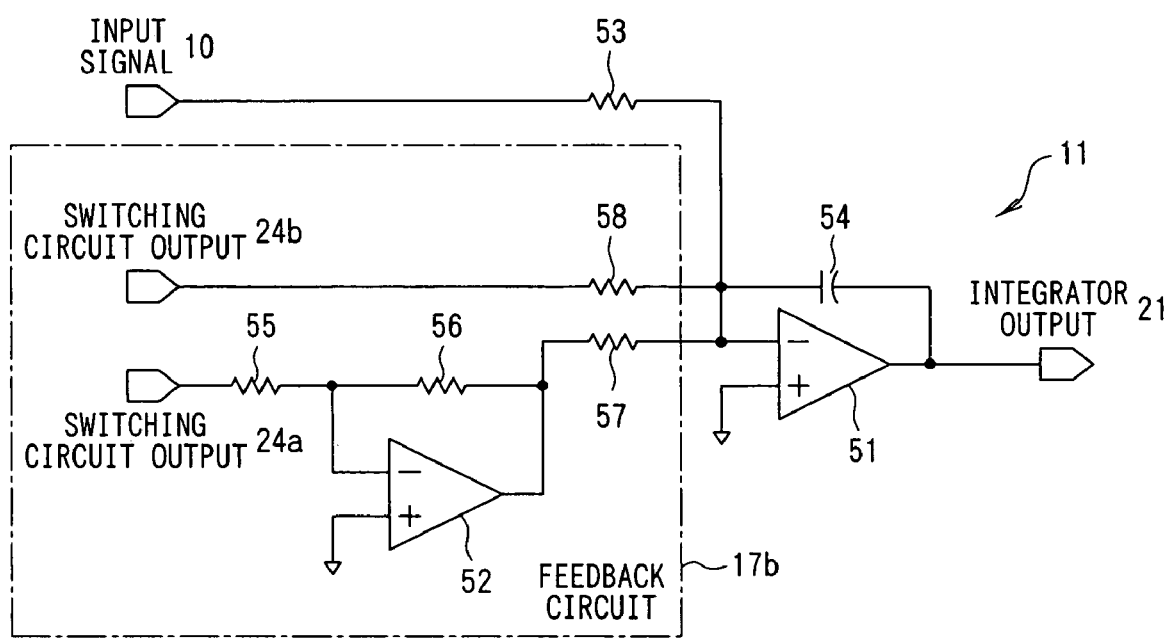
FIG. 13 is a circuit diagram showing a detailed configuration of an integrator and feedback circuit according to the fourth embodiment.
Figure 14:
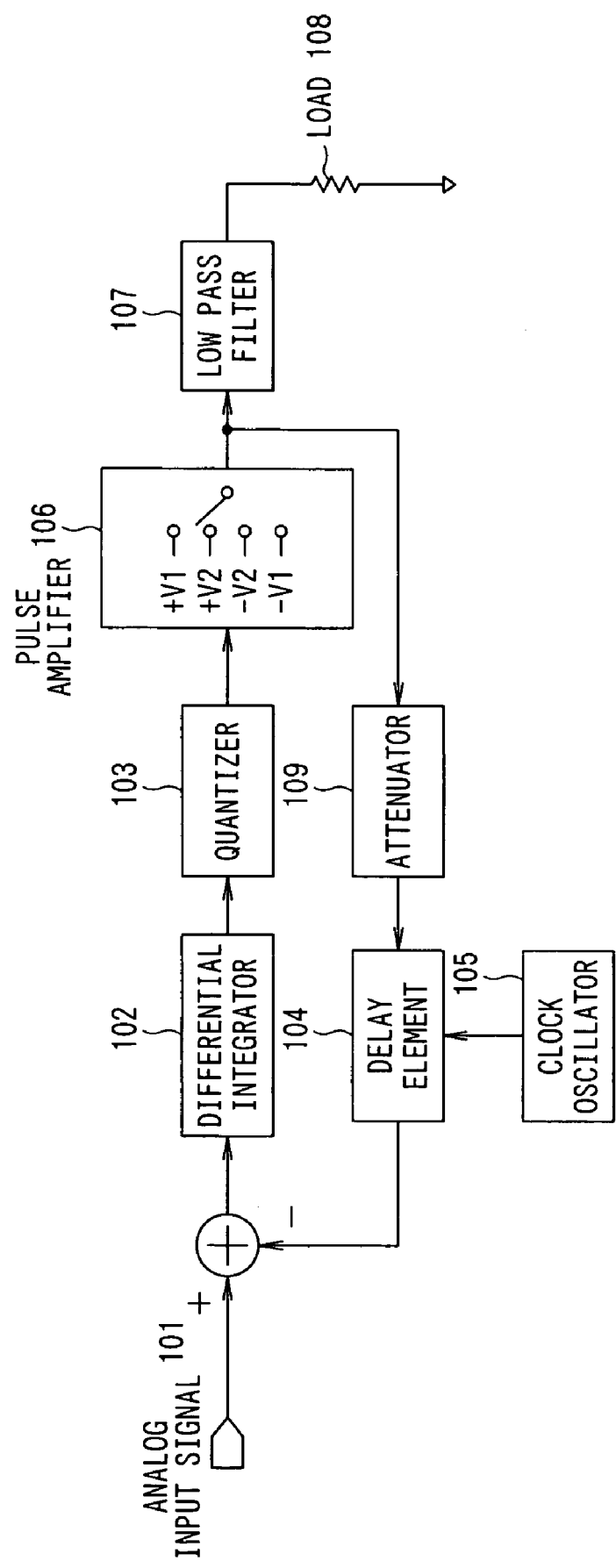
FIG. 14 is a block diagram showing a configuration of a digital switching amplifier according to a first example of the related art.
Figure 15:
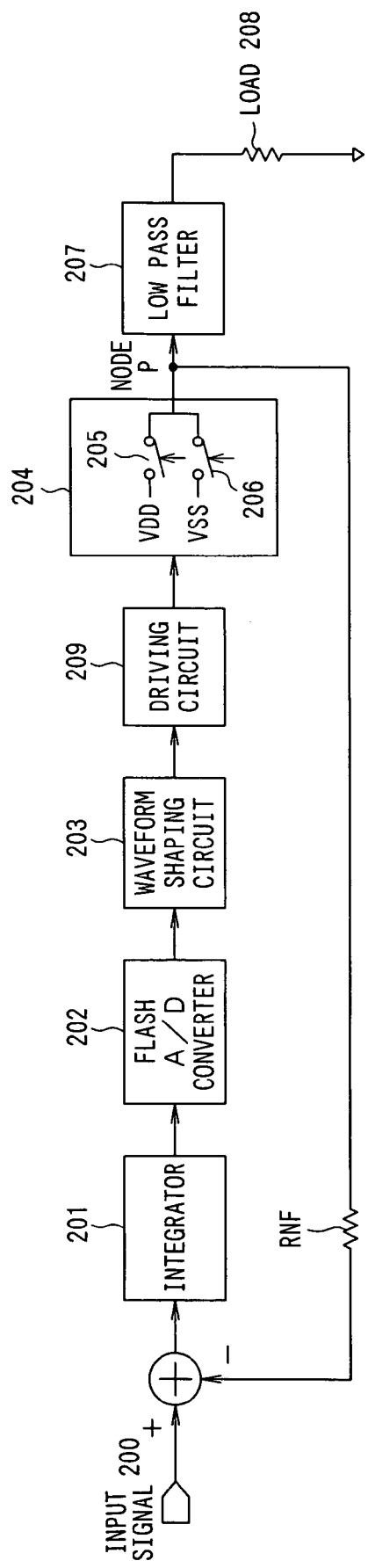
FIG. 15 a block diagram showing a configuration of a digital switching amplifier according to a second example of the related art.

FIG. 13 shows examples of the integrator 11 and feedback circuit 17b in FIG. 12. An area surrounded by the dashed line shows the feedback circuit 17b. The other area shows the integrator 11.

As shown in FIG. 13, the integrator 11 is composed of an operational amplifier 51 using MOS transistors, poly resistor 53 for input, and integral capacitor element 54 formed between double layers of polysilicon as a capacitive element.

As shown in FIG. 13, the feedback circuit 17b includes an inverting buffer for inverting the output 24a from the switching circuit 14a (in this example, consisting of an operational amplifier 52 and resistors 55 and 56), a feedback signal inputting resistor 57 for supplying the output of the inverting buffer to the integrator 11 as a feedback signal, and a feedback signal inputting resistor 58 for supplying the output 24b from the switching circuit 14b to the integrator 11.

In the fourth embodiment, since the feedback circuit 17b is configured as described above, the differential signal between the differential outputs 24a and 24b can be negatively fed back to the input of the integrator 11 when the switching circuits 14a and 14b deliver the differential outputs 24a and 24b.

(Other)

In the digital switching amplifier according to the present invention, an electrical signal whose direct current level is zero can be applied to a load during an inactive period of the pulse width modulation signal. In this case, when the load is single-ended as in the embodiments 1 and 3, a voltage equal to a voltage across the ground terminal of the load can be applied to the load. When the load is driven by the differential signal as in the embodiments 2 and 4, both terminals of the load can be driven by the same voltage as for example VSS. An electrical signal whose direct current level is zero can be applied to a load not by providing the load with an electrical signal, that is to say, the load is kept open not to drive the load.

During an active period of the PWM signal outputted from the pulse width modulator, either of a continuous value or a predetermined discrete time width can be taken.

In the present invention, the switching circuit can drive the load directly or by way of such filters as a low-pass filter, high-pass filter, band pass filter, filter with an equalizer characteristic, and filter for changing gain.

When a quantizing resolution is set finer in the vicinity of a level zero, as exemplified hereinbefore using the first embodiment, any of the embodiments of the present invention can be applicable though, respective quantizing resolutions may be adapted for magnitudes of values of plural electrical signals prepared for switching and outputting by the switching circuit with the active width of pulse width modulation signal kept constant at the finer region.

In other words, the present invention includes change of level of switching output by the switching circuit with the pulse width modulation signal kept constant in the vicinity of a level zero of the output of the integrator (the first region in FIG. 2).

What is claimed is:

1. A digital switching amplifier comprising:
   an integrator for integrating an input signal;
   a quantizer for quantizing the output signal of the integrator with resolutions different for each of predetermined signal regions;
   a pulse width modulator for pulse width modulating the output signal of said quantizer with proportionality coefficients different for each of said predetermined signal regions; and
   a switching circuit for providing a load with electrical signals different in value for each of said predetermined signal regions in response to the output signal of said pulse width modulator.

2. The digital switching amplifier according to claim 1 comprising:
   a feedback circuit for taking back the output signal of said quantizer to the input terminal of said integrator as negative feedback.

3. The digital switching amplifier according to claim 1 comprising:
   a feedback circuit for taking back the output signal of said switching circuit to the input terminal of said integrator as negative feedback.

4. The digital switching amplifier according to claim 1, wherein
   said quantizer determines which the output signal of said integrator is in said predetermined signal regions, and outputs the determined result to said pulse width modulator and said switching circuit.

5. The digital switching amplifier according to claim 4, wherein
   the number of said predetermined signal regions is two or more.

6. The digital switching amplifier according to claim 1, wherein
   said quantizer delivers the output at the region which said quantizer performs quantization with the finest resolution in response to the input signal intended for the level zero signal.

7. The digital switching amplifier according to claim 1, wherein
   the number of said proportionality coefficients for said pulse width modulator is two or more.

8. The digital switching amplifier according to claim 1, wherein
   said switching circuit is so configured as to provide said load with the smallest value of the electrical signal at the time of receiving said pulse width modulation signal responding to the quantized signal at said region which said quantizer performs quantization with the finest resolution.

9. The digital switching amplifier according to claim 8, wherein
   the number of said electrical signals of said switching circuit is two or more.

10. The digital switching amplifier according to claim 1, wherein
    said switching circuit applies across said load
    said electrical signal which direct current level is zero during an inactive period of said pulse width modulation signal,
    said electrical signal having a value prepared during an active period of said pulse width modulation signal with a first polarity and with a positive polarity of output of said quantizer, and
    said electrical signal having a value prepared during said active period of said pulse width modulation signal across said load with a polarity reverse to said first polarity and with a negative polarity of output of said quantizer.

11. The digital switching amplifier according to claim 10, wherein
    said active period of said pulse width modulation signal is a predetermined discrete time width.

12. The digital switching amplifier according to claim 1, wherein
    said switching circuit provides said load with said electrical signal via a filter connected in series to one terminal or both terminals of said load.

* * * * *